United States Patent [19]

Kohno et al.

[11] Patent Number: 5,233,313
[45] Date of Patent: Aug. 3, 1993

[54] HIGH POWER FIELD EFFECT TRANSISTOR AMPLIFIER

[75] Inventors: Masaki Kohno, Itami; Yoji Isota; Mitsuru Mochizuki, both of Kamakura, all of Japan

[73] Assignee: Mitsubishi Denki Kabushiki Kaisha, Tokyo, Japan

[21] Appl. No.: 907,011

[22] Filed: Jul. 1, 1992

[30] Foreign Application Priority Data

Jul. 8, 1991 [JP] Japan .................................. 3-166797

[51] Int. Cl.⁵ .............................................. H03F 3/193
[52] U.S. Cl. .................................. 330/277; 330/286; 330/306; 330/307
[58] Field of Search ................. 330/277, 286, 306, 307

[56] References Cited

PUBLICATIONS

Yokouchi et al. "4 GHz 3 Watts FET Amplifier for Digital Transmission", Conference, 1978 IEEE MTT-S International Microwave Symposium, Ottawa Canada, Jun. 27-29, 1978.
Tajima et al, "7-18 GHz GaAs FET Monolithic Power Amplifiers", IEEE GaAs IC Symposium, 1982, pp. 139-141.

Primary Examiner—James B. Mullins
Attorney, Agent, or Firm—Leydig, Voit & Mayer

[57] ABSTRACT

A high power field effect transistor (FET) amplifier which can provide a high gain over a wide bandwidth of a microwave range includes, on a first substrate on which a grounded-source field effect transistor is disposed, a series combination of an inductor and a capacitor connected between the gate of the FET and ground. The gate of the FET is coupled to an input impedance matching circuit disposed on a second substrate. The drain of the FET is coupled to an output impedance matching circuit disposed on a third substrate.

5 Claims, 5 Drawing Sheets

HIGH POWER FIELD EFFECT TRANSISTOR AMPLIFIER

This invention relates to a high power field effect transistor amplifier (hereinafter referred to high power FET amplifier) which exhibits a high gain over a wide frequency band in a microwave range.

BACKGROUND OF THE INVENTION

FIG. 1 schematically shows a major portion of a conventional high power FET amplifier, such as a high power GaAs FET amplifier. A GaAs FET 4 is formed on a GaAs substrate 2, with its source electrode S being grounded. The gate electrode G of the FET 4 is connected to a quarter wavelength distributed constant circuit 81 through a bonding wire 6 shown as an inductance in FIG. 1. The quarter wavelength distributed constant circuit 81 is connected through another quarter wavelength distributed constant circuit 82 to an input terminal 10. The two quarter wavelength distributed constant circuits 81 and 82 form an input impedance matching circuit 13.

The drain electrode D of the FET 4 is connected through a bonding wire 12 to a quarter wavelength distributed constant circuit 91 which, in turn, is connected to an output terminal 14 through another quarter wavelength distributed constant circuits 91 and 92 form an output impedance matching circuit 23. In the conventional amplifier shown in FIG. 1, each of the input and output impedance matching circuits comprises two quarter wavelength distributed constant circuits, but the number of quarter wavelength distributed constant circuits is not limited to two. Any number of distributed constant circuits with a given electrical length and a given impedance can be used to provide a desired impedance.

In order for the conventional high power GaAs FET amplifier shown in FIG. 1 to be able to provide a large output power, it employs a GaAs FET having a very large total gate width. Thus, the input impedance of the GaAs FET 4 itself is very small. Furthermore, for forming a high power GaAs FET amplifier in a hybrid circuit configuration with an FET and other circuit elements, impedance matching must be done with overall S parameters of the circuit inclusive of the FET 4 and the bonding wires 6 and 12, taken into account. In general, as the operating frequency increases, the overall S parameters become more inductive than capacitive. As stated previously, in the high power GaAs FET amplifier, impedance matching for the circuit inclusive of the FET 4 and the bonding wires 6 and 12 is provided by the two quarter wavelength distributed constant circuits 81 and 82 in the input side and the two quarter wavelength distributed constant circuits 91 and 92 in the output side.

As described above, in a conventional high power GaAs FET amplifier, the impedance of a GaAs FET is very low, and impedance matching must be provided by means of distributed constant circuits under conditions where variations with frequency of the S parameters of the GaAs FET 4 are large. Accordingly, the frequency range in which matching can be achieved with a gain which can be considered to be constant is undesirably narrow. In addition, in the conventional high power GaAs amplifier, the return loss at the input or output side is large, which results in a smaller effective power that can be supplied to a load.

FIG. 2 is a graph showing calculations of input and output return loss versus frequency of the conventional high power GaAs FET amplifier of FIG. 1 with S parameters under small signal conditions. A curve $S_{11}$ represents the return loss at the input and a curve $S_{22}$ represents the return loss at the output. For instance, over an operating frequency range of from 5.0 GHz to 9.6 GHz, the return loss $S_{22}$ is less than 6 dB, which is more or less satisfactory. However, the return loss $S_{11}$ at the input is greater than 6 dB over the same frequency range and its maximum value is as large as 3 dB.

FIG. 3 shows the gain versus frequency characteristic of the high power GaAs FET amplifier of FIG. 1, which shows that the gain $S_{21}$ is smaller than 8 dB and, in particular, it decreases to a value less than 5 dB at frequencies higher than 7 GHz. These values are not sufficient.

The present invention eliminates problems seen in conventional high power GaAs FET amplifiers such as the one described above. According to the present invention, a high power FET amplifier exhibiting a high gain over a frequency range wider than 1 octave is provided.

SUMMARY OF THE INVENTION

According to one feature of the present invention, a high power GaAs FET amplifier includes a field effect transistor in a grounded-source configuration which is disposed on a first substrate, an input impedance matching circuit which is disposed on a second substrate different from the first substrate and to which the gate of the field effect transistor is connected, an output impedance matching circuit which is disposed on a third substrate different from the first and second substrates and to which the drain of the field effect transistor is connected, and a series combination of an inductor and a capacitor connected between the gate of the field effect transistor and ground. The series combination is disposed on the first substrate together with the field effect transistor.

According to another feature of the present invention, a high power GaAs FET amplifier includes a GaAs field effect transistor (hereinafter referred to as GaAs FET) disposed in a grounded-source configuration on a first substrate of GaAs. The GaAs FET has its gate pad connected to an input impedance matching circuit disposed on a second substrate different from the first substrate. A metal-insulator-metal (MIM) capacitor is disposed on the first substrate. The gate pad of the GaAs FET is connected to the MIM capacitor via a metal member facing the first substrate with air interposed therebetween. The series combination of the metal member and the MIM capacitor is the inductor-capacitor series combination connected between gate of the GaAs FET and ground.

Because the inductor-capacitor series combination connected between the gate of the FET and ground is disposed on the same substrate as the FET, the overall input and output impedances including the FET and the series combination are both high, and variations with frequency of the S parameters of the amplifier are reduced. Accordingly, impedance matching can be easily achieved for obtaining high output power over a wide frequency range.

According to a second feature of the present invention, the substrate electrode which is one electrode of the MIM capacitor on the GaAs substrate is grounded through a via-hole to thereby ground the series combination including an inductor and a capacitor connected between the gate electrode of the FET and ground.

DESCRIPTION OF PREFERRED EMBODIMENTS

Figure 1:
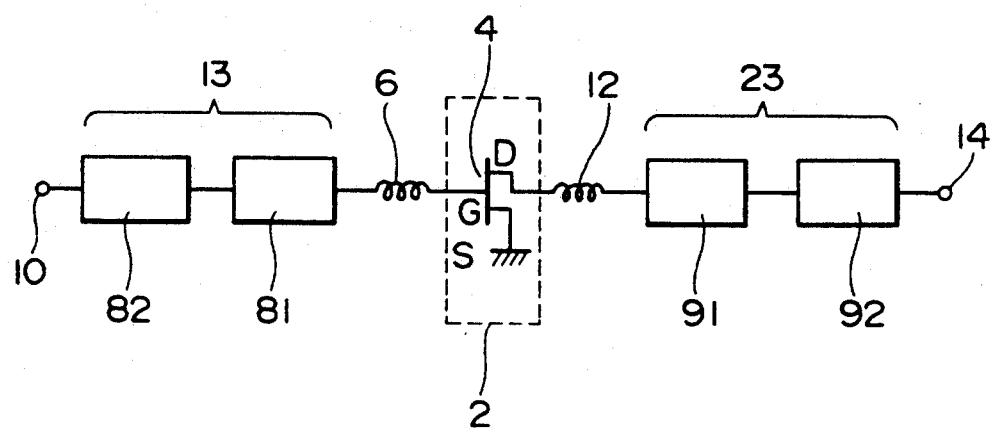
FIG. 1 shows a circuit arrangement of a conventional high power FET amplifier.
Figure 2:
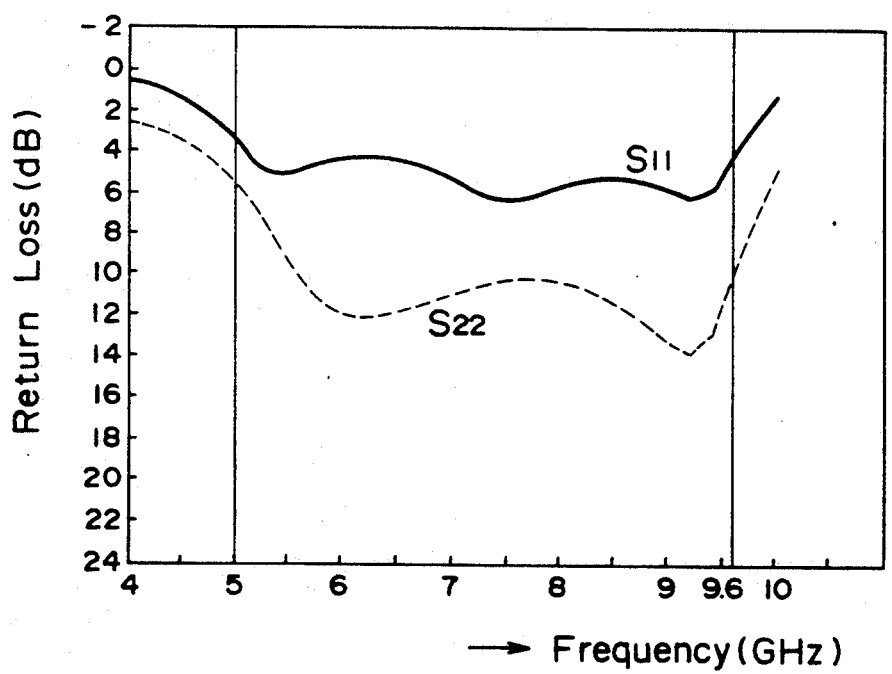
FIG. 2 shows a calculated input return loss ($S_{11}$) and output return loss ($S_{22}$) versus frequency characteristic of the conventional high power FET amplifier shown in FIG. 1.
Figure 3:
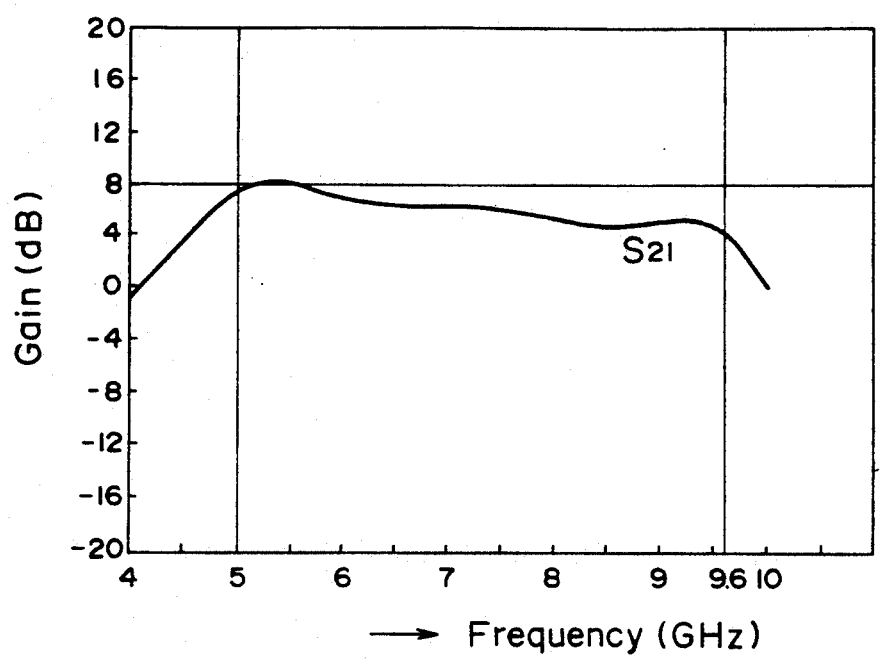
FIG. 3 shows a calculated gain ($S_{21}$) versus frequency characteristic of the conventional high power FET amplifier shown in FIG. 1.
Figure 4:
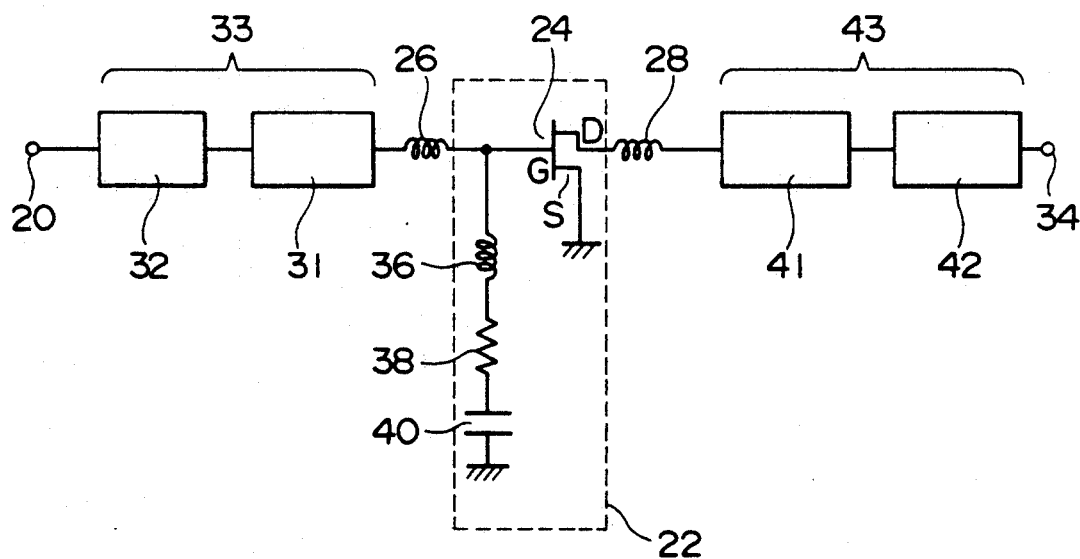
FIG. 4 shows a high power FET amplifier according to one embodiment of the present invention.

Now, the present invention is described with reference to the embodiment shown in FIG. 4. FIG. 4 is a schematic circuit diagram of a major portion of a high power FET amplifier according to the present invention. A GaAs FET 24 is disposed on a GaAs substrate 22. The FET 24 has its source electrode S grounded, and has its gate electrode G connected to a quarter wavelength distributed constant circuit 31 via a bonding wire 26 shown in the form of inductance. The quarter wavelength distributed constant circuit 31 is connected through another quarter wavelength distributed constant circuit 32 to an input terminal 20. The two distributed constant circuits 31 and 32 form an input impedance matching circuit 33. The drain electrode D of the FET 24 is connected through a bonding wire 28 to a quarter wavelength distributed constant circuit 41 which, in turn, is connected through another quarter wavelength distributed constant circuit 42 to an output terminal 34. The two distributed constant circuits 41 and 42 form an output impedance matching circuit 43.

A series connected combination of an inductor 36, a resistor 38 and a capacitor 40 is connected between the gate electrode G of the GaAs FET 24 and ground. The respective values of the inductor 36, the resistor 38 and the capacitor 40 are determined in relation to the total gate width of the FET 24 disposed on the substrate 22. The value of the inductor 36 may be from 0.01 nH to 0.1 nH, the value of the resistor 38 may be from 0 Ω to 0.1 Ω, and the value of the capacitor 40 may be from several tens of picofarads to 1000 pF.

In the illustrated embodiment, each of the input and output impedance matching circuits comprises two quarter wavelength distributed circuits, but any number of quarter wavelength distributed circuits having a given electrical length and a given impedance may be used to provide a desired impedance.

Figure 7:
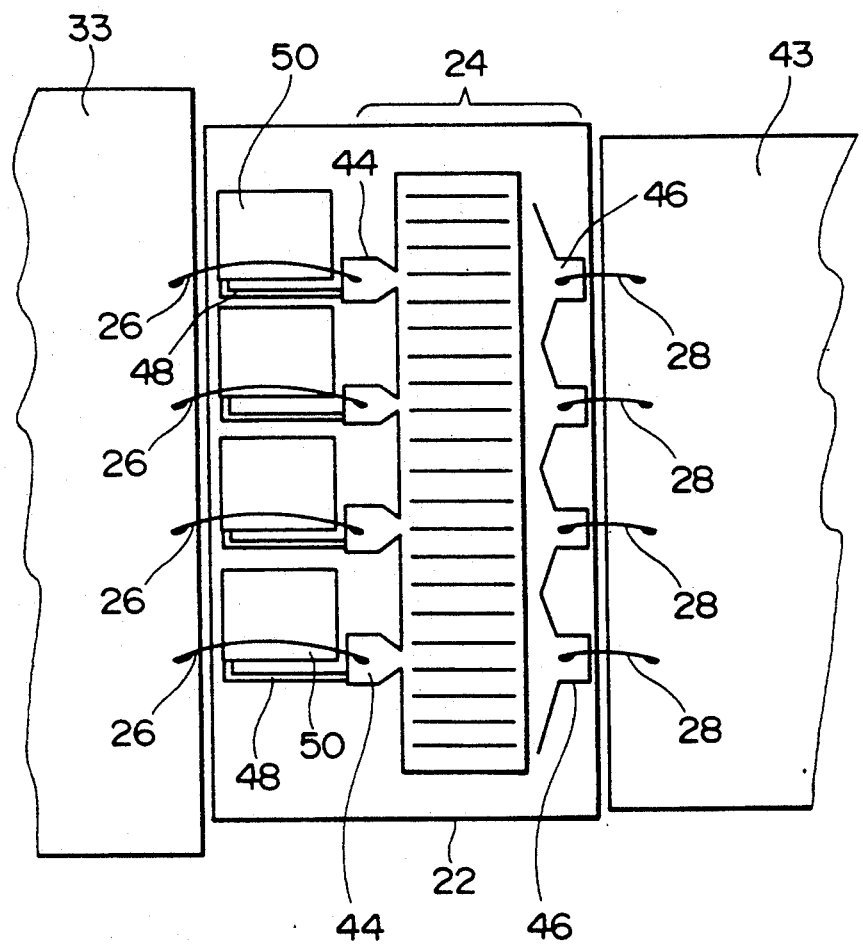
FIG. 7 shows the high power FET amplifier of the present invention disposed on substrates.
Figure 8:
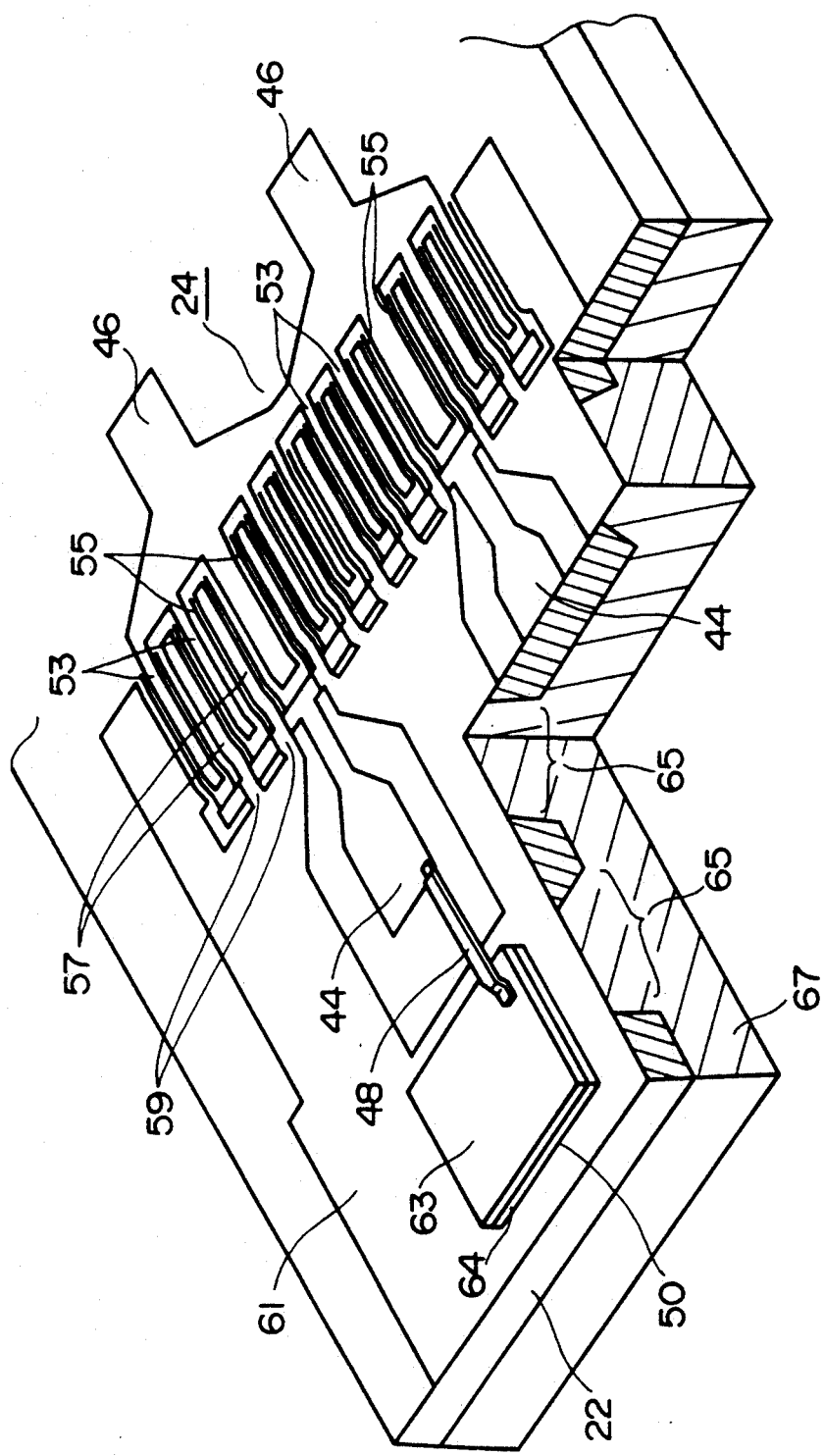
FIG. 8 is a partially cross-sectional, perspective view of the high power GaAs FET amplifier of the present invention shown in FIG. 7.

FIG. 7 is a plan view of a major portion of the high power GaAs FET amplifier according to the principle of the present invention shown in FIG. 4, and FIG. 8 is a partially cross-sectional, perspective view of an arrangement including the GaAs FET 24 disposed on the GaAs substrate shown in FIG. 7, and the MIM capacitors 50 which together form a capacitor corresponding to the capacitor 40 shown in FIG. 4. As shown in FIG. 7, gate pads 44 of the FET 24 of the high power FET amplifier are connected to the input impedance matching circuit 33 via the bonding wires 26. Drain pads 46 of the FET 24 are connected via the bonding wires 28 to the output impedance matching circuit 43. The gate pads 44 are also coupled to the respective MIM capacitors 50 by inductors 48. Each inductor 48 comprises a film of metal, such as Au, which faces the GaAs substrate 22 with air interposed therebetween. The inductors 48 together form an inductor corresponding to the inductor 36 of FIG. 4. The width, length and distance from the GaAs substrate 22 of each of the metal films forming the inductors 48 are appropriately determined such that a desired inductance value is provided.

The structure of the high power GaAs FET amplifier of the present invention shown in FIG. 7 is described in greater detail with reference to FIG. 8 which is a perspective view of the amplifier.

The FET 24 is disposed on the GaAs substrate 22. Drain fingers 53 forming together the drain electrode of the FET 24 are connected to respective drain pads 46. Gate members 55, shown line-shaped, form together the gate electrode G of the FET 24 and are connected to the respective gate pads 44. Source fingers 57 which together form the source electrode S of the FET 24 are coupled to respective source grounding pads 61 via respective air bridges 59 which span respective conductors for connecting the gate members 55 to the gate pads 44. Each of the gate pads 44 is connected to the upper electrode 63 of one of the MIM capacitors 50 by one of the inductors 48 which comprises a metal member or air bridge facing to the GaAs substrate. Each of the MIM capacitors 50 comprises the upper electrode 63 of, for example, Au, an insulator 64 of, for example, SiN, a lower electrode (not shown) of, for example, Au which is coupled to a grounded heat sink 67. The source grounding pads 61 are also coupled to the heat sink 67 through via-holes 65. In order for a high power GaAs FET to be capable of providing large output power, it is necessary to use a GaAs FET with a significantly large total gate width. The structure shown in FIG. 8 can realize such an FET.

Essentially, the impedance of a GaAs FET of a high output power GaAs FET amplifier such as the one shown in FIG. 4 is very low and, accordingly, the S parameters of such a high power GaAs FET amplifier are susceptible to variations with frequency because of the inductance of the amplifier. However, according to the present invention, before the S parameters of the low impedance FET amplifier become more inductive due to the bonding wires 26 and 28, the series connection of the inductor 36 and the capacitor 40 disposed on the GaAs substrate 22 functions to increase the impedance of the FET amplifier and also reduces variations of the FET S parameters with frequency. Impedance matching is achieved for the FET having the thus increased impedance and the thus reduced variations with frequency of effective S parameter, by means of the impedance matching circuits 33 and 34 disposed on substrates separate from the substrate on which the FET is disposed, which results in a high power GaAs FET amplifier having large input and output impedances, small variations of S parameters with frequency, and a wide operation range.

Distributed constant circuits for input and output impedance matching in the high power GaAs FET amplifier of the present invention should be determined by comprising a desired gain with respect to return losses. The input return loss $S_{11}$, the output return loss $S_{22}$, and the gain were measured for the subject high power GaAs FET amplifier with the following exemplified values. An FET chip with the total gate width of 50.4 mm was used. The values of the inductor 36, the resistor 38, and the capacitor 40 in the series combination connected between the gate electrode G of the FET 24 and ground were 0.019 nH, 0.001 Ω, and 900 pF, respectively. The gate electrode G and the drain electrode D of the FET 24 were connected to the impedance matching circuits 33 and 43, respectively, by means of the bonding wires 26 and 28 each having an inductance of 0.03 nH. The input impedance matching circuit 33 comprised a first distributed constant circuit having an impedance of 3.89 Ω and an electrical length of 11.00 mm, a second distributed constant circuit having an impedance of 16.06 Ω and an electrical length of 10.67 mm, and a third distributed constant circuit having an impedance of 37.51 Ω and an electrical length of 10.27 mm. The three distributed constant circuits were connected in the named order from the FET 24 to the input terminal 20. The output impedance matching circuit 43 comprised a first distributed constant circuit having an impedance of 2.51 Ω and an electrical length of 10.74 mm, a second distributed constant circuit having an impedance of 8.94 Ω and an electrical length of 10.67 mm, and a third distributed constant circuit having an impedance of 30.25 Ω and an electrical length of 10.66 mm, which were connected in the named order from the FET 24 to the output terminal 34.

Figure 5:
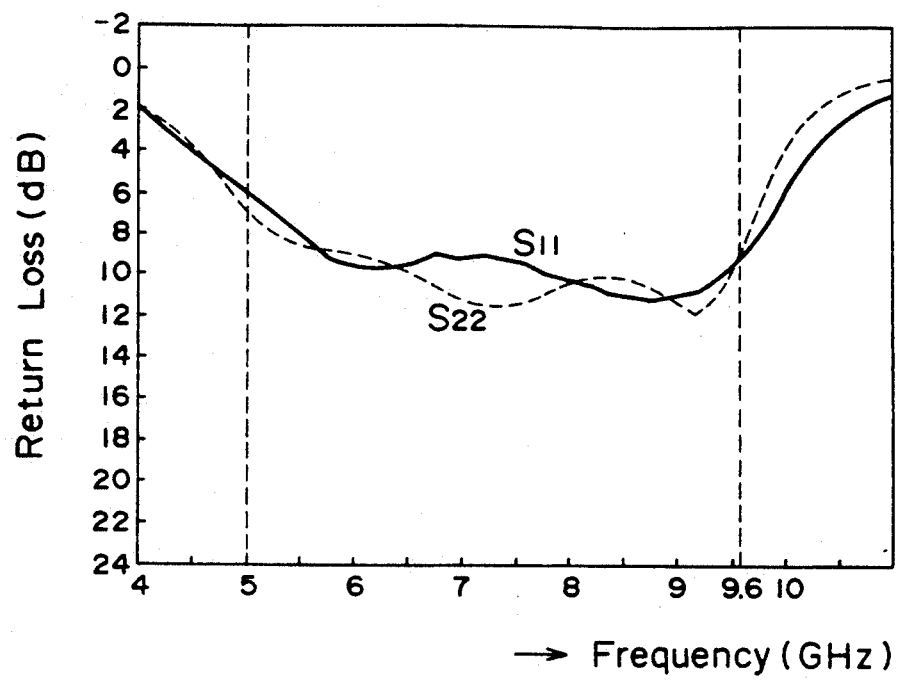
FIG. 5 shows a calculated input return loss ($S_{11}$) and output return loss ($S_{22}$) versus frequency characteristic of the high power FET amplifier of the present invention shown in FIG. 4.
Figure 6:
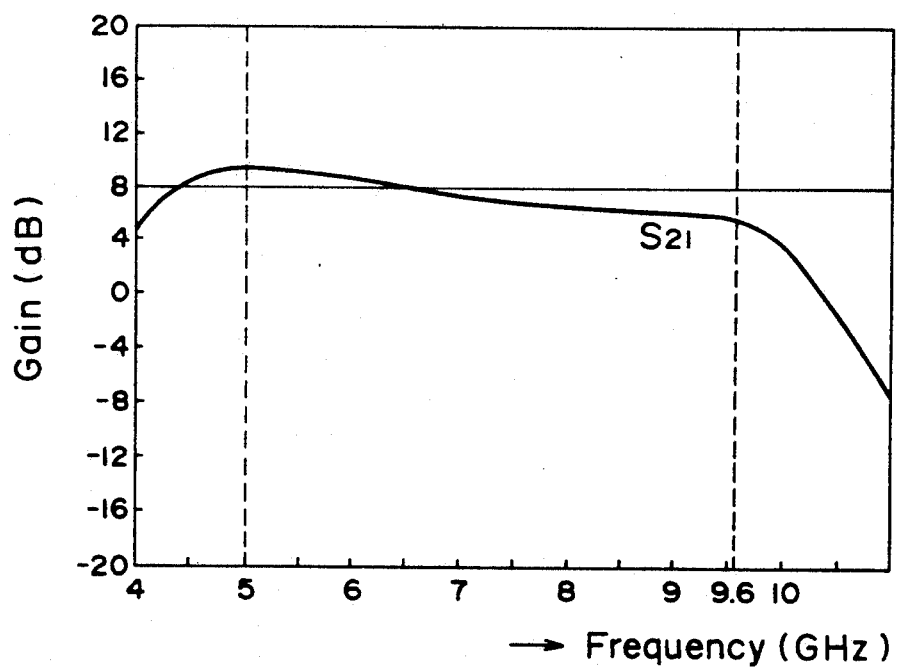
FIG. 6 shows a calculated gain ($S_{21}$) versus frequency characteristic of the high power FET amplifier of the present invention shown in FIG. 4.

FIG. 5 is a graph illustrating the calculated input and output return loss versus frequency characteristic of the example of the high power GaAs FET amplifier of the present invention having the above-exemplified values, and FIG. 6 is a graph of the gain versus frequency characteristic of the same high power GaAs FET amplifier. As shown in FIG. 5, both the input return loss $S_{11}$ and the output return loss $S_{22}$ were less than 6 dB over the operating frequency range of from 5.0 GHz to 9.6 GHz, which were satisfactory. Furthermore, as shown in FIG. 6, the gain was found to be larger than 6 dB over the operating frequency range, with its variations being gradual over a wide range. Thus, it has been confirmed that the gain characteristic of the high power GaAs FET amplifier has been improved relative to those of conventional high power GaAs FET amplifiers.

To sum up, according to the present invention a series combination of an inductor and a capacitor disposed on the substrate on which an FET of a high power FET amplifier is disposed is connected between the gate of the FET and ground. The use of this series combination increases both of the input and output impedances of the FET amplifier including the FET and the series combination, reduces variations of the S parameters of the high power FET amplifier with frequency, improves the input and output return loss characteristic, provides a high gain over a wide operating frequency range, and enables easy impedance matching. Further, according to another feature of the present invention, a structure is provided which facilitates the disposition of the FET and the series combination of the inductor and the capacitor on the same GaAs FET substrate, and also the connection of the series combination between the gate of the FET and ground.

What is claimed is:

1. A high power field effect transistor amplifier comprising:
   a first semiconductor substrate;
   a field effect transistor having a gate, a source, and a drain and connected in a grounded-source configuration and disposed on said first substrate;
   a second semiconductor substrate;
   an input impedance matching circuit disposed on said second substrate, the gate of said field effect transistor being coupled to said input impedance matching circuit;
   a third semiconductor substrate;
   an output impedance matching circuit disposed on said third substrate, the drain of said field effect transistor being coupled to said output impedance matching circuit; and
   an inductor and a capacitor disposed on said first substrate and connected in series between the gate of said field effect transistor and ground.

2. A high power field effect transistor amplifier according to claim 1 wherein each of said input and output impedance matching circuits comprises a number of electrically connected distributed constant circuits with a given electrical length and a given impedance, said number being determined such that a desired impedance is provided.

3. A high power field effect transistor amplifier according to claim 1 wherein each of said input and output impedance matching circuits comprises at least two serially connected quarter wavelength distributed constant circuits.

4. A high power field effect transistor amplifier according to claim 1 wherein said inductor has an inductance and said capacitor has a capacitance so chosen that the field effect transistor amplifier has high input and output impedances and that variations of the S parameters of said field effect transistor with frequency are small.

5. A high power field effect transistor amplifier comprising:
   a first GaAs substrate;
   a GaAs field effect transistor having a gate, a source, and a drain and disposed in a grounded-source configuration and disposed on said first substrate;
   a second semiconductor substrate;
   an input impedance matching circuit disposed on said second substrate to which the gate of said GaAs field effect transistor is coupled; and
   a metal-insulator-metal (MIM) capacitor disposed on said first GaAs substrate, a metal member facing and separated by air from said first GaAs substrate coupling said gate of said GaAs field effect transistor to said MIM capacitor wherein the combination of said metal member and said MIM capacitor comprises a series-connected inductor and capacitor connected between the gate of said GaAs field effect transistor and ground.

* * * * *